United States Patent
Carter (10) Patent No.: US 9,036,395 B2
(45) Date of Patent: May 19, 2015

(54) PROGRAMMED-STATE DETECTION IN MEMRISTOR STACKS

(75) Inventor: Richard J. Carter, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 320 days.

(21) Appl. No.: 13/533,699

(22) Filed: Jun. 26, 2012

(65) Prior Publication Data

US 2013/0343114 A1   Dec. 26, 2013

(51) Int. Cl.
*G11C 13/00* (2006.01)
*G11C 29/50* (2006.01)

(52) U.S. Cl.
CPC ...... *G11C 29/50008* (2013.01); *G11C 13/0007* (2013.01); *G11C 13/004* (2013.01); *G11C 13/0069* (2013.01); *G11C 2013/0092* (2013.01); *G11C 2213/71* (2013.01); *G11C 2213/75* (2013.01); *G11C 2213/77* (2013.01)

(58) Field of Classification Search
CPC ............ G11C 29/50008; G11C 13/0007; G11C 13/004; G11C 13/0069; G11C 2013/0092; G11C 2213/71; G11C 2213/75; G11C 2213/77
USPC ............... 365/148, 158, 163, 189.15, 189.07, 365/207, 210.1
See application file for complete search history.

(56) References Cited

U.S. PATENT DOCUMENTS

| | | | |
|---|---|---|---|
| 2008/0094885 A1* | 4/2008 | Ho et al. | 365/163 |
| 2009/0290411 A1* | 11/2009 | Xi et al. | 365/163 |
| 2010/0315870 A1* | 12/2010 | Abedifard | 365/171 |
| 2011/0069529 A1 | 3/2011 | Srinivasan et al. | |
| 2011/0182104 A1 | 7/2011 | Kim et al. | |
| 2011/0248381 A1 | 10/2011 | Tong et al. | |
| 2011/0279135 A1 | 11/2011 | Borghetti et al. | |
| 2012/0026776 A1 | 2/2012 | Yang et al. | |

FOREIGN PATENT DOCUMENTS

WO   WO-2011119158   9/2011

OTHER PUBLICATIONS

Fei, W. et al.; Design Exploration of Hybrid CMOS and Memristor Circuit by New Modified Nodal Analysis; Research Paper; IEEE Transactions on Very Large Scale Integration, (VLSI) Systems, vol. 20, No. 6, Jun. 2012.

* cited by examiner

*Primary Examiner* — J. H. Hur
(74) *Attorney, Agent, or Firm* — Van Cott, Bagley, Cornwall & McCarthy (57) ABSTRACT

A method for programmed-state detection in memristor stacks includes applying a first secondary switching voltage across a memristor stack to produce a first programmed-state-dependent secondary switching response in a memristor in the memristor stack. The programmed-state-dependent secondary switching response results in a detectable change in the electrical resistance of the memristor stack. The method also includes measuring a first electrical resistance of the memristor stack and inferring the programmed state of the memristor stack from the measured electrical resistance.

20 Claims, 7 Drawing Sheets

|  | After $V_{sw}$ | After $-V_{sw}$ | "$V_{sw}$, Read, $-V_{sw}$, Read" Protocol | |
|---|---|---|---|---|
| State "A" "ON" / "OFF" | "ON" / "OFF2" | "ON" / "OFF1" | Measurement: first "OFF2" then "OFF1" | Inference: State "A" |
| State "B" "OFF" / "ON" | "OFF1" / "ON" | "OFF2" / "ON" | Measurement: first "OFF1" then "OFF2" | Inference: State "B" |

PROGRAMMED-STATE DETECTION IN MEMRISTOR STACKS

BACKGROUND

Memristors are devices that can be programmed to different resistive states by applying programming energy. After programming, the state of the memristor can be read and remains stable over a specified time period. Large crossbar arrays of memristive elements can be used in a variety of applications, including non-volatile solid state memory, programmable logic, signal processing, control systems, pattern recognition, and other applications.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1:
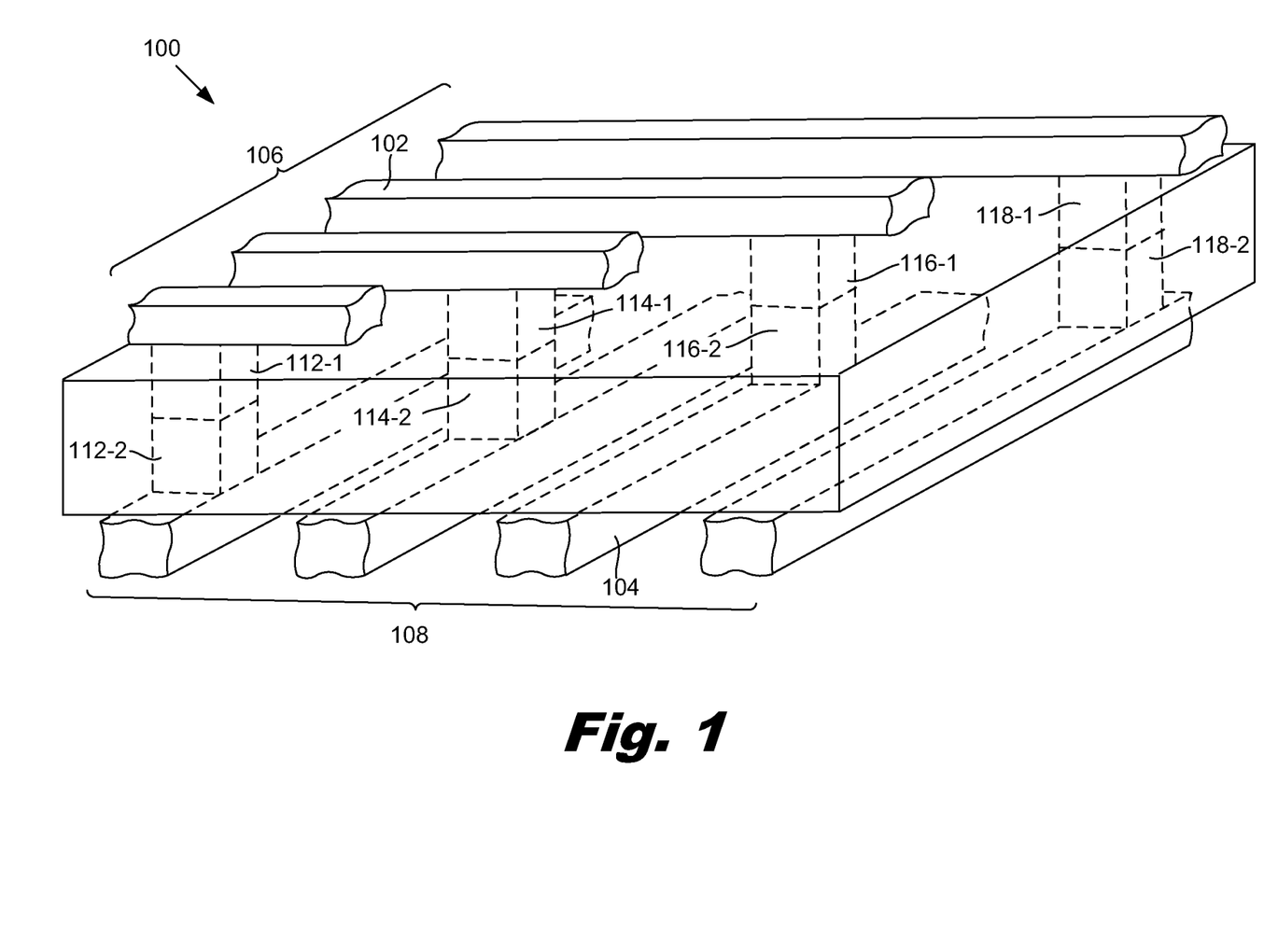
FIG. 1 is a perspective view of a crossbar array that is populated with two-device memristor stacks at each crossbar junction, according to one example of principles described herein.

FIG. 1 is a perspective view of a crossbar array (100) that is populated with two-device memristor stacks at each crossbar junction. The crossbar array (100) includes a first group of conductors (106) and a second group of conductors (108). The first group of conductors (106) crosses the second group of conductors (108) to form crossbar junctions. At the crossbar junctions, two-device memristor stacks (112, 114, 116, 118) are formed between conductors in the first group and conductors in the second group. For example, a two-device memristor stack (116) has been formed between a conductor (102) in the first group of conductors and a conductor (104) in the second group of conductors. For purposes of description, only a small portion of the crossbar array (100) has been illustrated. The crossbar array may include many more conductors, crossbar junctions, and memory devices.

Figure 2:
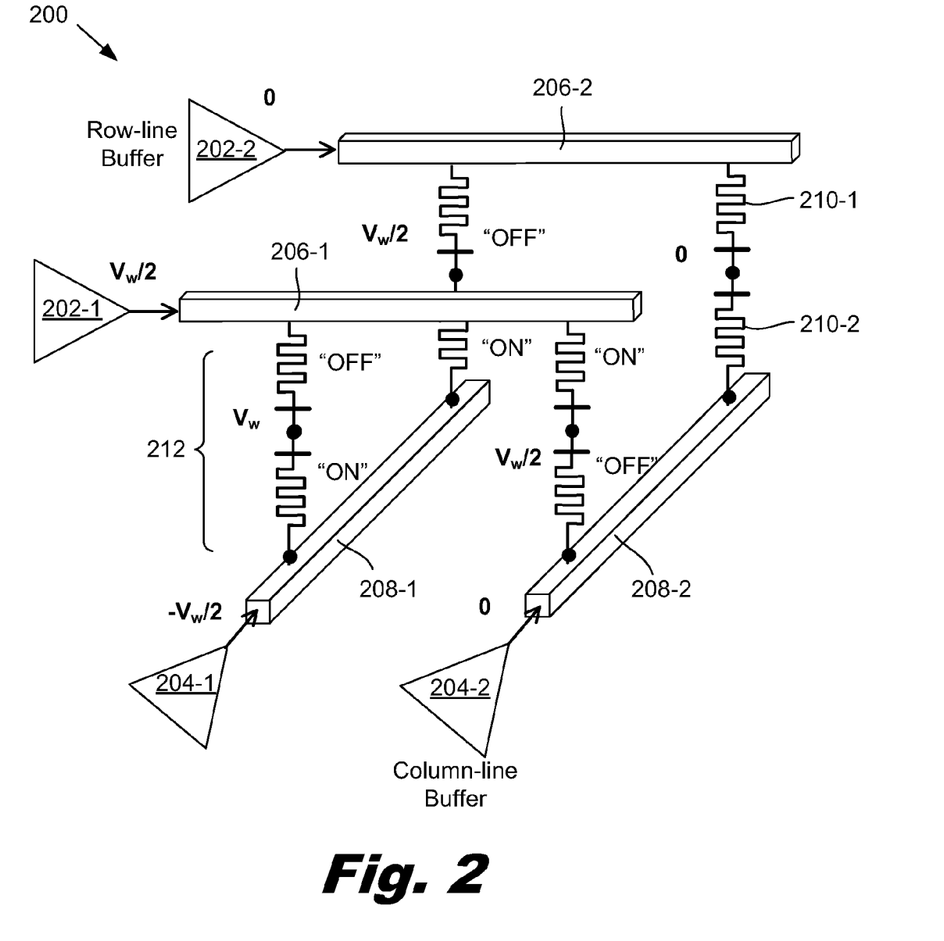
FIG. 2 is a schematic diagram of a crossbar array populated with two-device memristor stacks at each crossbar junction, according to one example of principles described herein.

FIG. 2 shows an electrical schematic of a crossbar architecture (200) that includes two-device memristor stacks at crossbar junctions. In this example, only two row lines (206) from the top crossbar layer are shown and only two column lines (208) from the bottom crossbar layer are shown. Two-device memristor stacks (210) are located at the junctions between the row lines and column lines. The two memristors in each stack have an opposite fabricated polarity or orientation. For example, if a top memristor (210-1) had a "right side up" orientation, the bottom memristor (210-2) in the stack would have an "up side down" orientation. Because of this difference in orientation, the two memristors react differently to an applied programming voltage. For example, the application of a first programming voltage across the two-device memristor stack may result in a first memristor (210-1) being programmed in the "ON" or low resistance state and the second memristor being programming in the "OFF" or high resistance state. Similarly, if a second programming voltage with an opposite magnitude is applied across the two-device memristor stack, the first memristor will be programmed in an "OFF" state and the second memristor will be programmed in an "ON" state. These primary stable configurations of the memristor stack permit these stacks to be used as memory elements for digital information, and will be termed henceforth the "primary" and/or "programmed" state of the stack. For example, a memristor stack capable of being programmed into two distinct primary states can be used to store one bit of information by a system employing such a stack. Note that it is possible to alter lesser physical properties of the memristors in a memristor stack without changing the primary programmed state of the stack, as viewed by the system.

Column-line buffers (204) and row-line buffers (202) control the voltages on the crossbars. To program a specific two-device memristor stack, a portion of the programming voltage is applied to the appropriate column line and a portion of the voltage is applied to the appropriate row line. In this example, a two-device memristor stack between a first row-line crossbar (206-1) and a first column-line crossbar (208-1) is to be programmed from its current primary state (state "A") to a second primary state (state "B"). As discussed below, state "A" may comprise a top memristor in an "ON" configuration (low resistance) and a lower memristor in the memristor stack in an "OFF" configuration (high resistance). The state "B" may comprise a top memristor in an "OFF" configuration (high resistance) and a lower memristor in the memristor stack in an "ON" configuration (low resistance). To program the memristor stack (212) from state "A" to state "B", half of the programming voltage ($V_W/2$) is applied by the appropriate row-line buffer (202-1) to the first row-line (206-1) and half of the programming voltage ($-V_W/2$) is applied by the appropriate column-line buffer (204-1) to the first column-line (208-1). Row-line buffers other than the activated row-line buffer (202-1) apply a zero voltage to their row lines. Similarly, column-line buffers other than the activated column-line buffer (204-1) apply a zero voltage to their columns lines.

Only the two-device memristor stack (212) at the junction between the activated column line (208-1) and activated row line (206-1) sees the full programming voltage $V_W$. Memristor stacks that are on the same row or column as the target memristor stack (212) see only half of the programming voltage ($V_W/2$). Memristor stacks (210) that are not connected to either of the activated row line or column line do not see an applied voltage.

This crossbar architecture with two-device memristor stacks has a number of advantages over crossbar architectures with single device memristors between the junctions. Crossbar architectures with single memristors at crossbar junctions have at least two challenges: potentially damaging current surges through memristors during programming and leakage currents that travel along undesirable ("sneak") paths within the crossbar array.

A crossbar architecture that includes a single memristor at crossbar junctions can damage the memristors during programming due to current spikes. For example, programming the memristor from an "OFF" state to an "ON" state can drive the memristor into an excessively low impedance state (or "shorted" state) that cannot be reversed. This is because the memristor does not self-limit the current that flows through it during programming. During the programming from an "OFF" state to an "ON" state, the initial resistance of the single memristor is high ("OFF" state) and a correspondingly low current flows through the device when a programming voltage is initially applied. However, the resistance of the memristor rapidly drops during the programming process and larger currents surge through the device. These larger currents can cause the device to heat up and increase the rate at which the resistance drops. This drop in resistance, in turn, increases the amount of current that flows through the single memristor crossbar junction. This positive feedback cycle can result in destructive currents flowing through the memristor that permanently damage it. Carefully designed current limiting-circuits or various closed-loop approaches are generally used to mitigate this issue. These current-limiting circuits can become even more complicated in an array setting. Additionally, these surges consume a large amount of electrical energy, which makes the crossbar array less efficient.

Leakage currents result from current traveling through memristors that are not targeted for reading or writing during a particular read or write process. For example, during programming driving a sufficiently large ON-switching voltage across a memristor selected for writing will necessarily involve driving a fraction of the write voltage (typically one-half) across other devices in the same row and column as the selected device. If these other devices are in the "ON" state, they may sink large currents when the half-write-voltage has been established across them. These large write currents may require excessively large row-line and column-line driver circuits and line-widths. The power implied by these currents may also exceed an acceptable system-imposed power budget for the array.

The crossbar arrays that incorporate two-device memristor stacks avoid these two issues. The dynamics of switching of a two-device memristor stack involve a locally self-limiting write operation that does not require complicated external circuitry. For example, the two-device memristor stacks avoid the issue of damaging current surges during programming because while one memristor in the two-memristor stack is turning "ON," the other memristor is turning "OFF." This will limit the minimum resistance of the two memristors in series so as to prevent current spikes. These crossbar arrays also solve the current leakage issue because one of the two memristors will always be in the high-impedance "OFF" state, vastly reducing the leakage current drawn by the half-selected same-row and same-column devices during a write operation.

However, for crossbar architectures with two-device memristor stacks, the challenge becomes one of successfully reading the programmed memory element state, made difficult by the fact that both primary stack states comprise an "ON" memristor and an "OFF" memristor in series. Thus, the two states are seemingly indistinguishable from the outer terminals of the stack. One solution is to use a "destructive read" to distinguish the states. In a destructive read, a voltage is applied that forces the memristor stack to a given primary state, potentially changing the state of one or more of memristors in a target memristor stack in the process. The initial programmed state of the memristor stack can be determined by sensing its behavior during this attempted switching. This technique destroys the original programmed state of the memory to read it. After a destructive read, the two-device memristor stack is reprogrammed to its primary state prior to the destructive read. The destructive read approach requires large amounts of energy and induces excessive wear on the memristors, limiting their lifetimes.

The principles below describe a method for reading the primary programmed state of two-device memristor stacks, as single memory elements or in a crossbar architecture, without a destructive read. The principles make use of the fact that the "OFF" memristor of the memristor stack is in one fabricated polarity for a memristor-stack in a primary "state A" and in the opposite fabricated polarity for a memristor-stack in the alternate primary "state B." The principles describe a method that employs the device's secondary switching behavior to discern the polarity of the "OFF" memristor in the stack, and hence the primary programmed memory element state. The advantage of this approach is that only secondary aspects of the device state are manipulated, at much lower energy, to successfully read the memory element state. In addition, by making feasible low-energy non-destructive reading of these memristor-stack arrays, the invention allows systems that adopt this architecture to avoid the high energy cost of writing memristors to the "ON" state that is seen in arrays having only a single memristor per crossbar junction.

Figure 3:
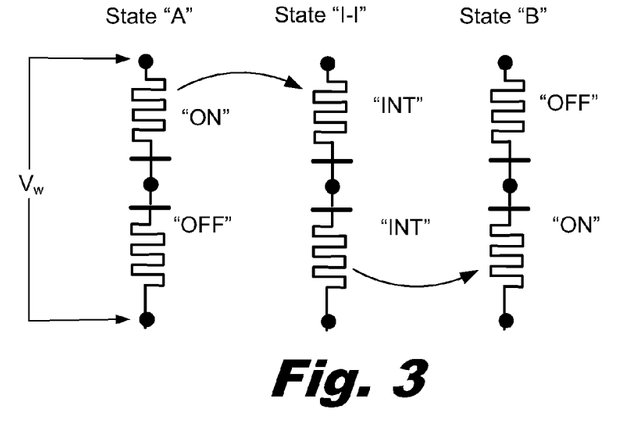
FIG. 3 is a diagram of switching in a two-device memristor stack when a programming voltage is applied, according to one example of principles described herein.

FIG. 3 shows three various states of a two memristor stack during a switching event. The two primary stable states of the memristor stack are defined as state "A" and state "B." In this example, the top memristor is "ON" and the bottom memristor is "OFF" in state A. In state B, the top memristor is "OFF" and the bottom memristor is "ON." In an intermediate "I-I" state, both memristors have an equal intermediate resistance "INT." This intermediate state occurs during programming. As noted above, the stack itself is never "ON" or "OFF," since in both of the stack's stable states, there are both "ON" and "OFF" memristors present.

FIG. 3 also shows each individual memristor with the "keyed" memristor symbol having a "bar" at one end to indicate the fabricated polarity of the device. For purposes of description, it is assumed that a positive voltage applied to the barred end of the memristor (with respect to the non-barred end) will drive the memristor toward the low-impedance "ON" state. FIG. 3 shows that like-polarity ends of the two devices in the memristor-stack memory element are linked to form an interior node that cannot be probed from the external terminals of the memristor stack. Viewed from these external terminals, the two memristors of the stack have opposite polarity and switch as described above.

FIG. 3 also depicts (via arrows) the sequence of states that the memristor stack goes through when being written from primary state "A" to primary state "B." Consider the application of a positive write voltage $V_W$ (applied to the top terminal of the memristor stack in state "A" with respect to the bottom terminal). This voltage will initially be dropped primarily across the high resistance bottom "OFF" memristor. This will begin to drive the bottom memristor toward the "ON" state by lowering its resistance. As the bottom memristor's impedance approaches that of the top memristor, the write current will increase and a non-negligible voltage will begin to develop across the top memristor. Because of the flipped polarity of the top memristor, this developing voltage and increasing current will begin driving the top memristor toward the "OFF" state. These processes continue until the impedance of both top and bottom memristors are equal, and the externally applied write voltage is divided equally between the two memristors. The impedance of the memristors in this "I-I" state depends on the device fabrication, but it is clearly an intermediate impedance somewhere between the "ON" and "OFF" impedances. At this point, the write operation enters a second phase in which the write current begins to fall as the top memristor continues to turn "OFF." By careful selection of the write voltage, the remaining write current during this phase is sufficient to turn the bottom memristor to the "ON" state, thus completing the transition from state "A" to state "B." A write voltage of opposite polarity, due to the symmetry of the device, will reverse the steps described and will switch the memory element from state "B" back to state "A."

With this background established, secondary switching characteristics, which may be present in the memristor, will now be described. The secondary switching characteristics are dependent on the device materials and construction. Secondary switching, in general terms, is the manipulation of the memristive device state using smaller voltages and/or modified pulse-widths from programming voltages used in changing the device between its two primary states.

Figure 4:
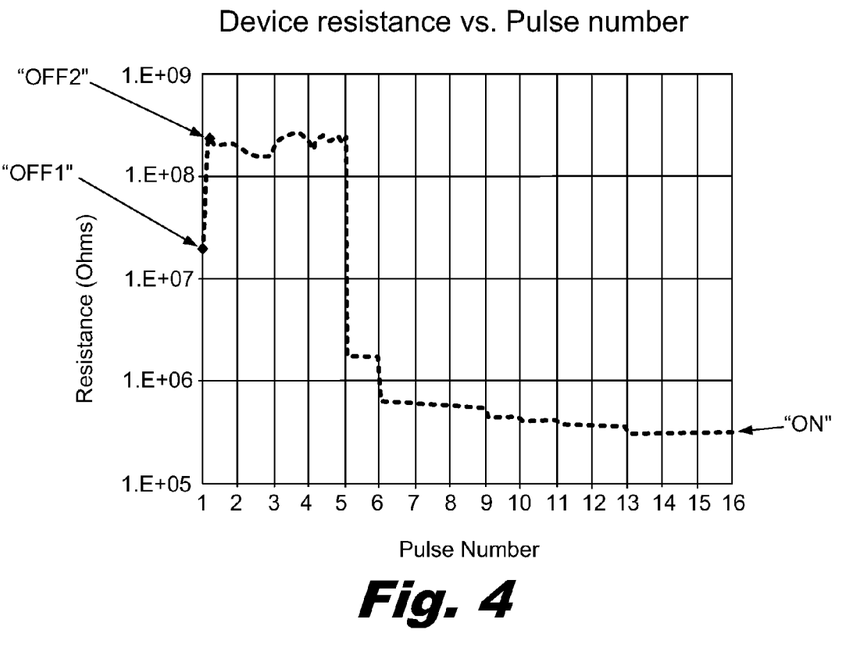
FIG. 4 is a chart showing secondary switching characteristics of a memristor, according to one example of principles described herein.

FIG. 4 shows secondary switching behavior of a single thin film titanium oxide ($TiO_2$) memristor with a thickness of 50 nanometers. This memristor can be switched to the "ON" state with the application of a single $-4.5V$ write pulse. FIG. 4 shows a single "OFF"-to-"ON" switching event that was a result of a number of $-3.5V$ 5 μsec pulses, delivered at one-minute intervals. Note that the $-3.5V$ write pulse is of lesser magnitude than the $-4.5V$ write pulse required to switch the device reliably to the "ON" state in a single write pulse.

The horizontal axis of the graph shows the number of applied voltage pulses and the vertical axis of the graph shows electrical resistance of the memristor in ohms. In this test, the voltage pulses were applied at one-minute intervals to allow for accurate measurement of the effects of each pulse and to gauge the non-volatility of the device state.

In FIG. 4, the initial state of the device was produced by switching the device strongly to the "OFF" state. This is designated as the "OFF1" state. In this "OFF1" state the electrical resistance of the device was approximately 20 MΩ. The initial 5 μsec $-3.5V$ pulse changed the impedance (as measured by a low-bias resistance measurement) from 20 MΩ to 200 MΩ. This order-of-magnitude impedance change is significant and in the opposite direction from the ultimate expected response to negative applied voltages. Three subsequent 5 μsec pulses produced no impedance change, but then the device finally responded as expected to the $5^{th}$ pulse by switching to an "ON" state of approximately 2 MΩ. Additional pulses 6-16 further decrease the resistance of the memristor to approximately 300 kΩ.

This test demonstrates that the "OFF" state can be manipulated in significant ways using voltages of lesser magnitude than the primary switching voltage. Further, this manipulation of the "OFF" state appears to be, at least for the minutes-long duration of the test, non-volatile. As shown in FIG. 4, two different "flavors" of "OFF" state seen in this device can be identified: the "OFF1" state and the "OFF2" state. The "OFF1" state is arbitrarily assigned to the lower initial resistance of the device and the "OFF2" state is defined as the greater of the two resistances that results from manipulation by the "secondary switching" write voltage, here $-3.5V$. In additional tests, it was discovered that these secondary switching events were repeatably exhibited when voltage pulses that had lower magnitudes and/or shorter pulse widths than a programming voltage were applied. These additional tests confirmed that the transition between "OFF1" state and the "OFF2" state is both repeatable and non-volatile, at least for the minutes-long duration of the tests.

Figure 5:
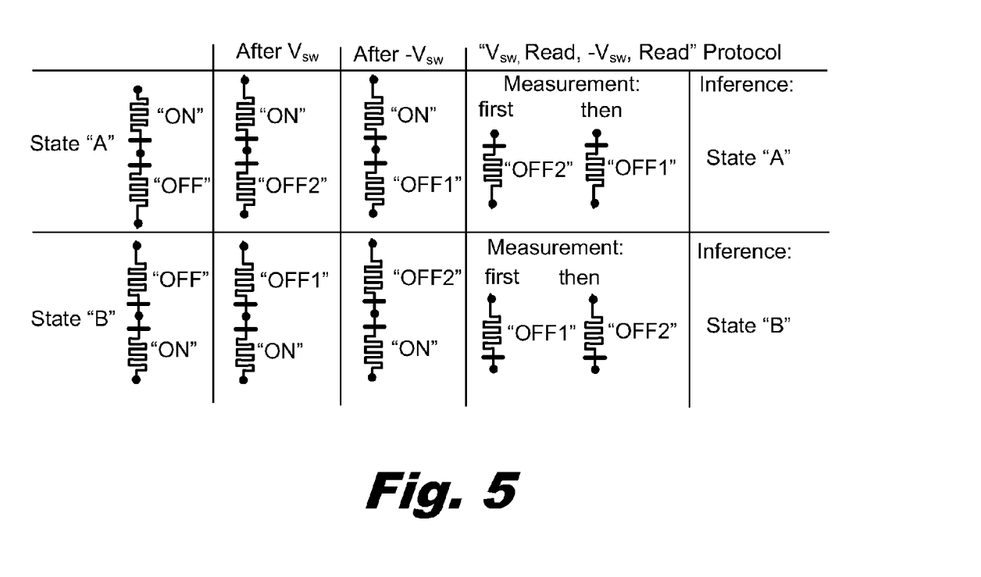
FIG. 5 is diagram showing a sequence for reading the programmed state of two-device memristor stacks using secondary switching characteristics of the memristors, according to one example of principles described herein.

The "ON" to "OFF" memristor states are reversible. Over the lifetime of the memristor, a programming voltage can be applied to the memristor to switch the memristor between the "ON" and "OFF" states thousands or millions of times. Assuming similar reversibility of the "OFF1"/"OFF2" state manipulations, a matrix in FIG. 5 shows an illustrative method for reading the state of two memristor stacks using secondary switching. A first memristor stack is initially in primary state "A" and a second memristor stack is initially in primary state "B.".

FIG. 5 depicts that after application of a positive secondary switching pulse $V_{SW}$, a memristor stack in state "A" will have its "OFF" memristor switched to the "OFF2" state, while after a similar pulse, a memristor stack in state "B" will have its "OFF" memristor switched to the "OFF1" state. This is shown in the left most column of FIG. 5. The difference in behavior results from the fact that the "OFF" memristor is of opposite fabricated polarity with respect to the applied pulse in the two cases. Conversely, after a negative $-V_{SW}$ pulse, a memristor stack in state "A" will have its "OFF" memristor switched to the "OFF1" state, while after a similar pulse, a memristor stack in state "B" will have its "OFF" memristor switched to the "OFF2" state. This is shown in the next column of FIG. 5.

Note that the impedance measurement made of a memristor stack is dominated by the impedance of the "OFF" memristor, because of the series arrangement of the two memristors in the stack. Thus, any state changes made to the "ON" memristor by the secondary switching pulses $V_{SW}$ and $-V_{SW}$ will be negligible. The changes in the "OFF" memristors as a result of application of the secondary switching voltage can be significant and readily distinguishable by circuitry outside the crossbar array. For example, in FIG. 4 there is an order-of-magnitude change in resistance between the "OFF1" state and the "OFF2" state. The switching of the "OFF" memristors by the secondary switching voltages is dependent on the primary programmed state of the memristor stack but does not alter the data stored by the memory stack, as held by the primary state "A" vs. state "B."

The next column shows a measurement sequence that includes application of a positive secondary switching voltage $V_{SW}$, after which a reading is made to determine the electrical resistance of the memristor stack and then application of negative secondary switching voltage $-V_{SW}$, followed by a reading of the electrical resistance of the memristor stack. For the upper memristor stack on the chart, shown as programmed to state "A," the resistance measurements indicate an electrical resistance of OFF2 after the positive secondary switching voltage is applied and an electrical resistance of OFF1 after the negative electrical resistance is applied. The last column shows that this results in the correct inference that this memristor stack is in state "A."

For the lower memristor stack on the chart, shown as programmed to state "B," the resistance measurements indicate an electrical resistance of OFF1 after the positive secondary switching voltage is applied and an electrical resistance of OFF2 after the negative electrical resistance is applied. Since this OFF1-OFF2 resistance sequence is opposite to the OFF2-OFF1 sequence expected of a memristor stack in state "A," the lower memristor stack can be correctly inferred to be in state "B," as shown in the last column. Thus, using a read protocol that determines the response of the memristor stack to the application of two different polarity secondary switching voltages, the state of the memristor stack can be determined. This is only one example of a read protocol that can be used to determine the state of a memristor stack based on the secondary switching characteristics of memristors.

Figure 6A:
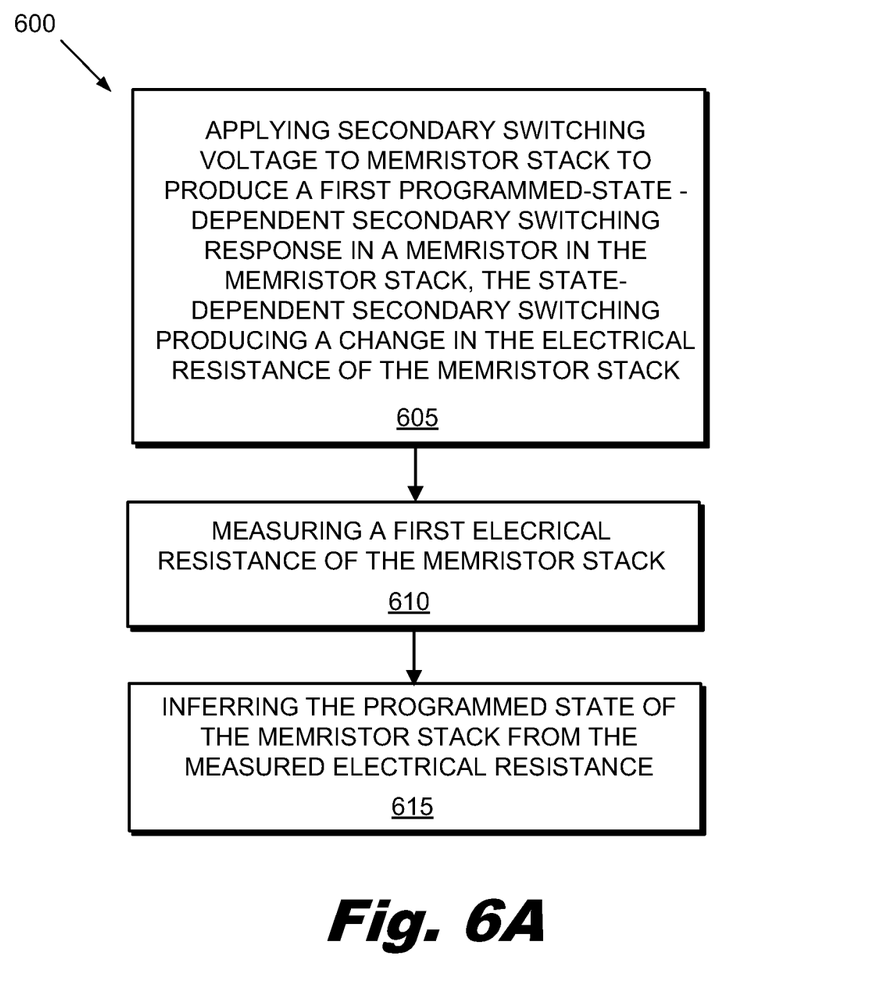
FIGS. 6A and 6B are flowcharts showing an illustrative method for programmed-state detection in memristor stacks using secondary switching characteristics of the memristors, according to one example of principles described herein.

FIG. 6A is a flow chart of a method (600) for state detection of memristor stacks. The method includes applying a first secondary switching voltage across a memristor stack to produce a first state-dependent secondary switching in a memristor in the memristor stack, the state dependent secondary switching producing a change in the electrical resistance of the memristor stack (block 605). A first electrical resistance of the memristor stack is measured (block 610) and the state of the memristor stack is inferred from the state of the measured electrical resistance (block 615). This inference may be made in a variety of ways, including comparison to a predetermined threshold or comparison to another measured resistance. Also, the measurement of the first electrical resistance of the memristor stack may include making a single-ended or differential measurement. Single-ended measurement means one voltage is applied and one current is measured, and the resistance is calculated by R=V/I. Differential measurement means taking two different current samples at different voltages, possibly of opposite polarity, and the resistance is calculated by dividing the difference in the applied voltages by the difference in the measured currents.

Figure 6B:
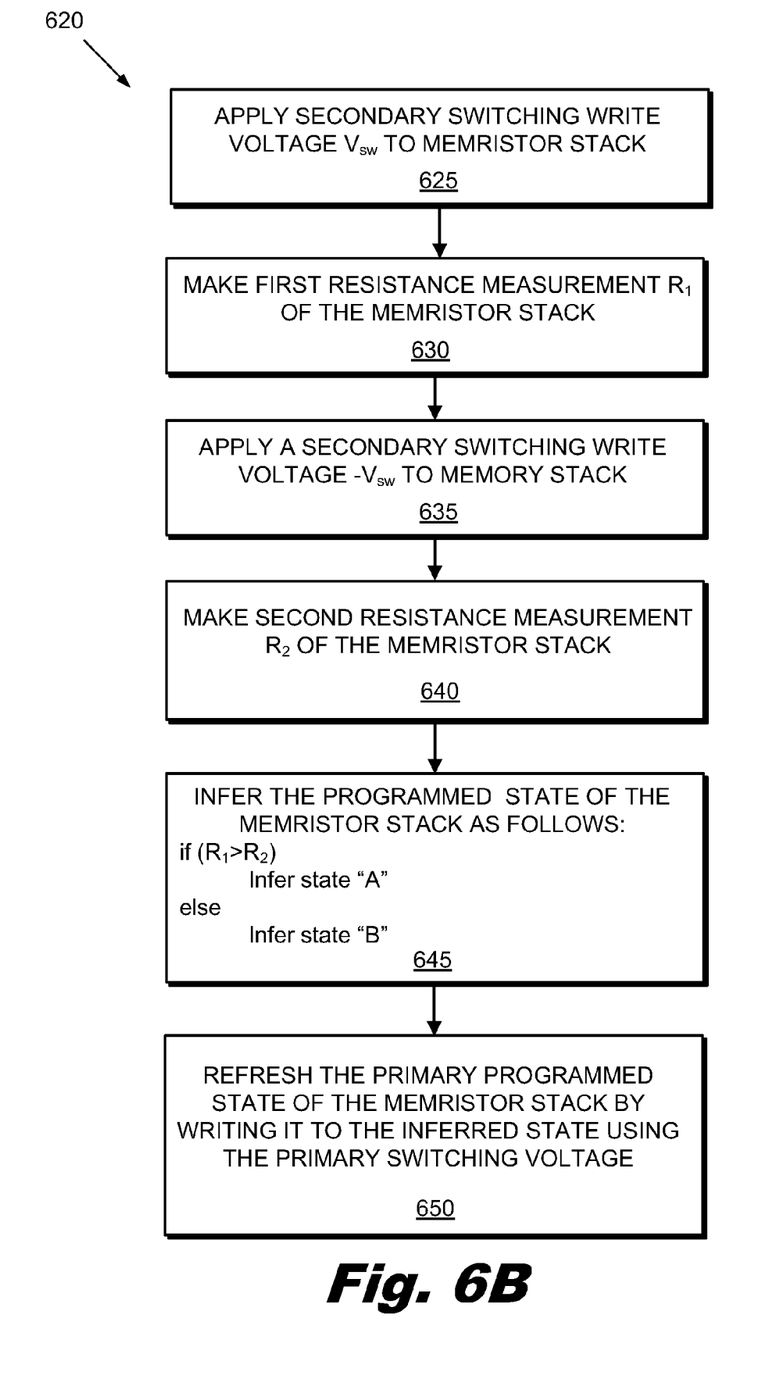

FIG. 6B is a flow chart of one example of a method (620) for programmed-state detection of a two-device memristor stack. After the two-device memristor stack has been programmed to the desired state (either state "A" or state "B"), a secondary switching voltage $V_{SW}$ is applied to the two-device memristor stack (block 625). A first impedance measurement $R_1$ of the two-device memristor stack is made (block 630). A secondary switching voltage $-V_{SW}$ is applied to the two-device memristor stack (block 635). A second impedance measurement $R_2$ is made (block 640). The state of the two-device memristor stack can then be inferred (block 645). If $R_1$ is greater than $R_2$, the two-device memristor stack is in state "A". Otherwise, if $R_1$ is not greater than $R_2$, the two-device memristor stack is in state "B." In some examples, the primary switching state of the memristor stack can be refreshed by writing it to the inferred state using the primary switching voltage (block 650).

Note that this method does not refer to absolute "OFF1" or "OFF2" impedances. Instead, the method compares the two impedance measurements $R_1$ and $R_2$. This differential approach has the advantage that it is less susceptible to device variation, i.e. the devices fabricated do not need to perform against an absolute standard. Another way of expressing the inference made in this example is, "Do we see the $R_1$:$R_2$ impedance relationship expected of an OFF2:OFF1 sequence (i.e. does the impedance go down)? If 'yes,' then we have a memristor-stack in state 'A,' else state 'B.'"

Secondary switching characteristics of the memristors can be utilized in a variety of ways to determine the state of the memristor elements. Further, the memristor stack impedance measurement can be made in a number of ways, for example, as a single current measurement performed at the time of the secondary switching write pulse $V_{SW}$ or $-V_{SW}$. Alternatively, the impedance measurement can be performed at a lower voltage, and in either a differential or single-ended manner.

For the memristor performance shown in FIG. 4, $R_{threshold}$ could be selected to be 100 MΩ. The "OFF1" state has a resistance of 20 MΩ and the "OFF2" state has a resistance of 200 MΩ. After applying the secondary writing voltage, the resistance measurement $R_1$ is made and compared to $R_{threshold}$ of 100 MΩ. If $R_1$ is greater than 100 MΩ, state "A" is inferred. If $R_1$ is not greater than 100 MΩ, state "B" is inferred.

The $V_{SW}$ voltages and pulse widths are not identical to those employed by the primary switching mechanism because this would result in a destructive read. Additionally, there is no preferred polarity in which the secondary switching voltage is applied. The secondary switching voltage can have the same or opposite polarity of the primary switching voltage applied to program the memory device. If two consecutive secondary switching voltages are applied, there is no particular polarity that must be applied first.

The primary switching mechanism exhibits the following characteristics:
There are switching write voltages $+V_W$ and $-V_W$ and pulse widths that alter the memory element state between two defined primary states.
The primary states have a non-volatility that meets system-driven requirements.
The primary states of the memory elements are not disturbed by the $+V_W/2$ and $-V_W/2$ half select voltages delivered ad infinitum for the given pulse width and write duty cycle, or until such time as a primary state refresh is performed or the system lifetime is exceeded.

In contrast, the secondary switching mechanism is defined by the following:
There are secondary switching write voltages $+V_{SW}$ and $-V_{SW}$ and pulse widths that alter secondary aspects of the memory element state without switching the device between its primary states, either by employing lower magnitude pulses or shorter pulse widths or both.
The secondary aspects of the memory element state have a non-volatility that needs only be maintained for the duration of the steps of the read operation. One example of these steps is shown in FIGS. 6A and 6B above.
If the method is used in a memory array setting, the secondary aspects of the memory element state are not disturbed by single $+V_{SW}/2$ and $-V_{SW}/2$ half-select voltages.
In one example, the secondary switching voltages may have a magnitude that is greater than half of the programming voltage and less than the programming voltage ($V_W > V_{SW} > V_{W/2}$). This prevents inadvertent secondary switching in devices that are half selected during application of programming (writing) voltages.

The principles and methods described above can be used to switch and read two-device memristors stacks in a variety of architectures, including individual memristor stacks and memristor stacks that are incorporated into arrays. The memristive devices may be specifically engineered to exhibit or accentuate desirable secondary switching properties. For example, the material type, geometry, dopant species, and other components of the memristive device can be selected to exhibit the desired secondary switching behavior.

Figure 7:
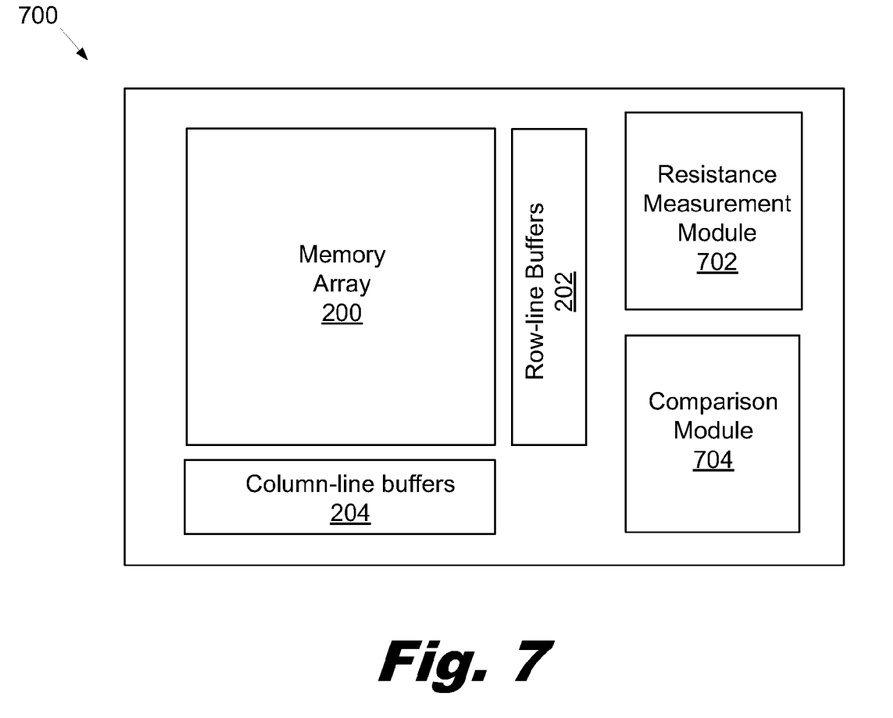
FIG. 7 is a system for programmed-state detection of memristor stacks in a memory array, according to one example of principles described herein.

FIG. 7 shows a system (700) for programmed-state detection of memory elements in a memory array (200). As shown in FIG. 2, the memory array (200) includes a layer of row lines and a layer of column lines. The row lines cross over the column lines to form junctions and memristor stacks are sandwiched between a row line and a column line at each junction. Each memristor stack includes a first memristor and a second memristor in electrical series between the row line and the column line, the first memristor and second memristor having opposite fabricated polarities.

Column-line buffers (204) are connected to the column lines and row-line buffers (202) are connected to the row lines. The buffers are configured to apply a portion of a programming voltage and a portion of secondary switching voltage along some or all of the column lines and row lines. For example, if the entire memory array (200) is being erased/written, a programming voltage $V_W$ could be applied to all the column lines and row lines. The column lines could apply a voltage $-V_W/2$ and the row lines could apply a voltage of $V_W/2$.

If it is desirable to detect the programmed state of a particular memristor stack or stacks, the appropriate column-line and row-line buffers could be activated to apply a portion of a secondary switching voltage to the row-line crossbars and the balance of the secondary switching voltage to the column-line crossbars such the memristor stack or stacks whose programmed state is to be detected are exposed to the secondary switching voltage.

A resistance measurement module (702) measures an electrical resistance of the memristor stacks after a first secondary switching voltage is applied to the memristor stacks. The resistance measurement module (702) may be part of the same die as the memristor array (200), part of the same electronics package as the memristor array or may be a separate chip in communication with the memristor array.

The comparison module (704) then receives the electrical resistance measurement from the resistance measurement module (702) and compares the electrical resistance of the memristor stack(s) to a threshold to infer the programmed state of the memristor stack(s). For example, the threshold may be a predetermined resistance value. This predetermined resistance value is selected to distinguish changes resulting from the application of the first secondary switching voltage. If the electrical resistance measurement is greater than the threshold, the comparison module infers that the memristor stack is in a first state. If the electrical resistance measurement is not greater than a threshold, the comparison module infers that the memristor stack is in a second state.

Additionally or alternatively, the threshold may be a separately measured electrical resistance. For example, the threshold may be a second electrical resistance measurement of the memristor stacks when a second secondary switching voltage with polarity opposite the first secondary switching voltage is applied to the memristor stacks to make a differential resistance measurement. In this case, if the first electrical measurement is greater than the second electrical measurement, a comparison module infers that the memristor stack has a first programmed state. If the first electrical measurement is not greater than the second electrical measurement, the comparison module infers that the memristor stack has a second state.

The system shown in FIG. 7 is only an example. A variety of other arrangements could be used. For example, the functions of the measurement module and the comparison module could be combined into a single module. In other examples, the functionality of the buffers, measurement module, and comparison module could be combined into a single module. This single module may be part of the same die as the memory array or may be a separate die in communication with the memory array.

In conclusion, principles and methods described above offer the prospect for low memory element switching energy in a large memory array setting. This is accomplished by using a memory array design that has a two-device memristor stack as the memory element, rather than having a single memristor at each crossbar junction. This has the advantage of bypassing the "ON"-switching issue of large leakage currents that flow through half-selected same-row and same-column devices in the "ON" state. Also bypassed is the issue of current surges through the device during programming. The two-device memristor stack has self-limiting current during programming.

Given that both primary programmed states of a memristor stack comprise an "ON" memristor and an "OFF" memristor in series, the challenge is to distinguish between these two states. The principles described above manipulate secondary switching characteristics of the memristor stack to distinguish between the two programmed states. This results in significantly lower energy consumption during read operations. The use of these secondary switching characteristics eliminates the need for a destructive read, which requires significant energy, and reduces the lifetime of the memristor stack.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method for programmed-state detection of memristor stacks, in which each memristor stack comprises two memristors of opposite fabrication polarity such that, in each of two primary stable configurations, the two memristors of each stack are in opposite resistance states, comprising:
   applying a first secondary switching voltage across a memristor stack to produce a first programmed-state-dependent secondary switching response in a memristor in the memristor stack, the programmed-state-dependent secondary switching response producing a change in the electrical resistance of the memristor stack;
   measuring a first electrical resistance of the memristor stack; and
   inferring a programmed state of the memristor stack from the measured electrical resistance by determining the fabrication polarity of a memristor of the stack that is in a first resistance state.

2. The method of claim 1, in which the secondary switching voltage has a magnitude or a pulse duration that is less than that of a programming voltage that changes a primary programmed state of the memristor stack.

3. The method of claim 1, in which the secondary switching voltage has a magnitude that is less than a programming voltage that changes a primary programmed state of the memristor stack and greater than half the programming voltage.

4. The method of claim 1, in which the memristor stack comprises a first memristor and a second memristor, the first memristor having a fabricated polarity opposite the second memristor, in which a first primary state of the memristor stack comprises the first memristor having an "OFF" state and the second memristor having an "ON" state and a second state of the memristor comprising the first memristor having an "ON" state the and second memristor having an "OFF" state.

5. The method of claim 4, in which application of the first secondary switching voltage results in the first programmed-state-dependent secondary switching response occurring in the memristor having an "OFF" state.

6. The method of claim 1, in which measuring the first electrical resistance of the memristor stack comprises making a single-ended measurement.

7. The method of claim 1, in which measuring the first electrical resistance of the memristor stack comprises making a differential measurement.

8. The method of claim 1, in which inferring the programmed state of the memristor stack comprises comparing the first electrical resistance of the memristor stack to a predetermined threshold.

9. The method of claim 1, further comprising applying a second secondary switching voltage across the memristor stack and measuring a second electrical resistance, in which inferring the programmed state of the memristor stack comprises comparing the first electrical resistance to the second electrical resistance.

10. The method of claim 1, further comprising refreshing a primary programmed state of the memristor stack by writing it to the inferred programmed state using a primary programming voltage.

11. A method for programmed-state detection of memristor stacks comprising:
applying a programming voltage to a memristor stack to program the memristor stack to a programmed state, the memristor stack comprising a first memristor with a first fabricated polarity and a second memristor with a second fabricated polarity opposite the first polarity, the programmed state comprising a first memristor in a high resistance OFF state and a second memristor in a low resistance ON state;
applying a first secondary switching voltage across the memristor stack to produce a first electrical resistance in the first memristor;
measuring the first electrical resistance of the memristor stack;
applying a second secondary switching voltage having an opposite polarity of the first secondary switching voltage across the memristor stack, the second secondary switching voltage to produce a second electrical resistance in the first memristor, in which the first electrical resistance and second electrical resistance are programmed-state dependent;
measuring the second electrical resistance of the memristor stack;
inferring the programmed state of the memristor stack by comparing the first electrical resistance to the second electrical resistance; and
refreshing the memristor stack by reapplying the programming voltage according to the inferred programmed state.

12. The method of claim 11, in which inferring the programmed state of the memristor stack comprises:
if the first electrical resistance is greater than the second electrical resistance, infer a first programmed state; and otherwise, infer a second programmed state.

13. The method of claim 11, in which the secondary switching voltages have a magnitude or a pulse duration that is less than that of a programming voltage that changes the primary programmed state of the memristor stack.

14. The method of claim 11, in which the first secondary switching voltage has a magnitude that is less than a programming voltage that changes the primary programmed state of the memristor stack and greater than half the programming voltage.

15. The method of claim 11, in which application of the first secondary switching voltage results in a first programmed-state-dependent secondary switching response occurring in the memristor having an "OFF" state.

16. A system for programmed-state detection of memristor stacks in a memory array comprising:
the memory array comprising a layer of row lines and a layer of column lines, the row lines crossing over the column lines to form junctions;
the memristor stacks, each memristor stack sandwiched between a row line and a column line at a junction; each memristor stack comprising a first memristor and a second memristor in electrical series between the row line and the column line, the first memristor and second memristor having opposite fabrication polarities;
column-line buffers to selectively apply a portion of a programming voltage and a portion of a secondary switching voltage to each of the column lines,
row-line buffers to selectively apply a portion of a programming voltage and a portion of the secondary switching voltage to each of the row lines;
a resistance measurement module to measure an electrical resistance of the memristor stacks after a first secondary switching voltage is applied to the memristor stacks; and
a comparison module to compare the electrical resistance of the memristor stacks to a threshold to infer the state of the memristor stacks.

17. The system of claim 16, in which the threshold is an electrical resistance of the memristor stacks when a second secondary switching voltage with polarity opposite the first secondary switching voltage is applied to the memristor stacks.

18. The system of claim 16, in which the threshold comprises a predetermined resistance value.

19. The system of claim 16, in which the secondary switching voltage has a magnitude or a pulse duration that is less than that of a programming voltage that changes a primary programmed state of the memristor stack.

20. The system of claim 16, in which the secondary switching voltage has a magnitude that is less than a programming voltage that changes a primary programmed state of the memristor stack and greater than half the programming voltage.

* * * * *